United States Patent [19]

Ngo

[11] 4,028,692
[45] June 7, 1977

[54] LIQUID CRYSTAL DISPLAY DEVICE

[75] Inventor: Peter Dinh-Tuan Ngo, Colts Neck, N.J.

[73] Assignee: Bell Telephone Laboratories, Incorporated, Murray Hill, N.J.

[22] Filed: Sept. 15, 1975

[21] Appl. No.: 613,220

[52] U.S. Cl. .................. 340/324 M; 315/169 R; 340/166 EL; 340/173 LT; 350/160 LC
[51] Int. Cl.² .................. G02F 1/13; H01J 17/48
[58] Field of Search .... 340/324 M, 324 R, 166 EL, 340/166 R, 173 LT; 315/169 R, 169 TV; 350/160 LC

[56] References Cited
UNITED STATES PATENTS

| | | | |
|---|---|---|---|
| 3,609,747 | 9/1971 | Ngo | 340/166 EL |
| 3,763,468 | 10/1973 | Ovshinsky et al. | 340/166 R |
| 3,824,003 | 7/1974 | Koda et al. | 340/324 R |
| 3,840,695 | 10/1974 | Fischer | 358/61 |
| 3,895,373 | 7/1975 | Freiser et al. | 350/160 LC |
| 3,904,924 | 9/1975 | Hilsum et al. | 340/166 EL |
| 3,932,026 | 1/1976 | Sprokel | 350/160 LC |

*Primary Examiner*—David L. Trafton
*Attorney, Agent, or Firm*—William Ryan; Ronald D. Slusky

[57] ABSTRACT

A matrix array of liquid crystal cells is defined by overlapping pluralities of row and column conductors confining a layer of liquid crystal material. Each row conductor is connected through a bilateral threshold switch to one side of a source of periodic alternating polarity sustain signals, and the column conductors are sequentially connected to the other side of the source. When an initial charge is deposited on selected ones of the capacitors forming the liquid crystal cells, the series combination of the resulting stored voltage and the sustain signals is sufficient to exceed the threshold of the bilateral switch, thereby connecting the previously selected cells to the source of alternating source on a column-by-column basis so as to recharge the previously selected cells. Since charged cells exhibit differing electro-optic properties from uncharged cells, a graphical image may be generated and stored without the need for information-bearing refresh signals.

9 Claims, 6 Drawing Figures

LIQUID CRYSTAL DISPLAY DEVICE

BACKGROUND OF THE INVENTION

1. Field of the Invention

This invention relates to display devices and systems, and, in particular, to display devices and systems using liquid crystal materials. In its more particular aspects, the present invention relates to matrix display systems having liquid crystal devices at each matrix cross point.

2. Description of the Prior Art

Liquid crystal display devices are well known in the art, generally including a pair of spaced plates having conductive layers deposited on the opposed facing surfaces thereof, and having a layer of liquid crystal material retained between these surfaces. There are a number of different materials which exhibit liquid crystal properties, and there are a number of control mechanisms for causing such materials to assume the different states required of a material for use in practical display devices. See, for example, "Projecting Images With Liquid Crystals," by L. K. Anderson, *Bell Laboratories Record*, Vol. 52, No. 7, July/August 1974, pp. 222–229, and "Liquid Crystal Displays in Low Power Applications," by J. A. Castellano and G. W. Taylor, *IEEE* 1974 *Intercon Record of Technical Papers*, Session 25, Mar. 26–29, 1974, Paper 25/3.

A preferred class of liquid materials having a number of advantageous fabrication and operating characteristics is that including materials exhibiting nematic liquid crystal states. The so-called field-effect mode of operating a nematic liquid crystal cell typically involves the application of an electric field across the conductive layers of the cell, thereby to realign the molecules of liquid crystal material and change the degree of polarization induced by the cell on incident light. Thus, for example, in a field-effect twisted-nematic liquid crystal cell, the no-field polarizing effect of the cells is such as to induce a 90° rotation in polarization, while the full-field condition eliminates the polarizing effect completely, i.e., incident light polarization is not rotated to any substantial degree. By placing an external polarizer-analyzer pair with complementary (90° rotated) polarization directions about such a cell, the no-field condition is made to correspond to essentially complete transmission through the cell, while the full field condition corresponds to total absorption in the analyzer.

A principal advantage of the nematic field effect liquid crystal display cell is its low voltage, low power operation. Typical field effect operating voltages are from 5 to 7 volts and power consumption is of the order of $10^{-6}$ watts/cm$^2$ of display area, i.e., such that a segmented digit of the type used in watches, e.g., can be driven from a single miniature battery for well over a year.

An important limitation of field effect liquid crystal devices in some applications is the relatively long turn-on time. Thus, for example, the time from application of the voltage pulse to generate the required field to the time that the maximum electro-optic effect (e.g., substantially complete untwisting) is achieved is typically 2–10 milliseconds. Another characteristic of field effect liquid crystal devices is that they have no intrinsic memory, i.e., the untwisting field must be applied constantly.

Drive circuitry for liquid crystal displays is somewhat complicated by the above-recited limitations. In particular, the need to refresh field effect twisted nematic liquid crystal display devices has largely militated against any but the more complicated multiplexing and scanning systems. For example, the above-cited Castellano, et al paper describes one multiplexing scheme involving patterns of information-dependent signals having three components to selectively activate a segmented display. Another system described in U.S. Pat. No. 3,840,695 issued Oct. 8, 1974 to A. G. Fischer for use in a television display involves a transistor per display point with associate peripheral scanning.

U.S. Pat. No. 3,835,463 issued Sept. 10, 1974 to Tsukamoto et al describes means for varying X and Y pulse patterns having selectable phases and geometry to control the transparency of a liquid crystal cell, while in U.S. Pat. No. 3,740,717, issued June 19, 1973 to Huener et al., a typical X-Y matrix liquid crystal system using unipolar pulses is described.

Each of the above prior art systems, however, suffers from complexity of circuit arrangements not justified in many applications, and each suffers further from the need to continually refresh the elements defining a display entity with information-bearing signals.

SUMMARY OF THE INVENTION

In accordance with one embodiment of the present invention a plurality of liquid crystal display cells are formed in standard fashion over an area defined by an overlapping grid of X and Y conductors. These conductors are conveniently deposited on glass substrates which also serve to confine a thin layer of liquid crystal material. Each X conductor is typically connected to a bilateral threshold switch, the other side of each switch being connected to a first source of half-select alternating polarity sustain signals. Each Y conductor is sequentially connected by a scanned connector to a second source of half-select alternating polarity sustain signals.

A source of write signals initially stores a charge on selected ones of the capacitors forming the display cells. The resulting stored voltage, when algebraically combined with the two half-select signals exceeds the threshold of the bilateral switch, thereby resulting in a recharging of the previously selected cells, but with reversed polarity. Cells not previously selected do not possess a stored charge and cannot give rise to a voltage which, when added to the applied sustain signals, is sufficient to exceed the voltage threshold of the associated threshold switch. Thus, no charging of previously unselected cells results. Upon the application of subsequent sustain signals, the series combination of sustain signals and capacitor-stored voltage again exceeds the switch threshold, and the capacitor at the originally selected cells are alternatively positively and negatively charged. Those cells not originally selected fail repeatedly to be charged and remain in their off state.

Means are also provided for selectively discharging cells which have been charged, i.e., means are provided to "erase" written cells. Once erased, a cell no longer experiences alternating charging.

Because written and non-written cells exhibit contrasting electro-optic properties, it is possible using the present invention in its various embodiments to generate graphical images. Further, these images may be maintained without the need for applying information-bearing refresh signals, i.e., the cells need not be constantly rewritten.

DETAILED DESCRIPTION

Figure 1:
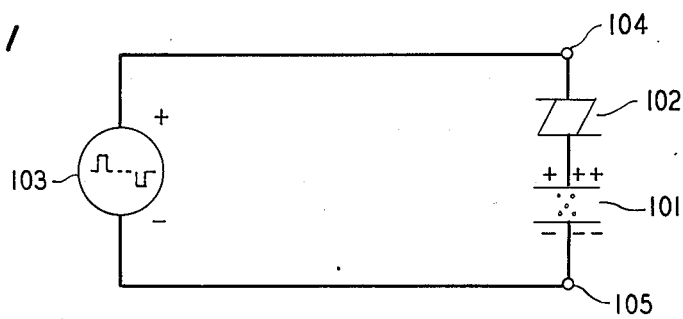
FIG. 1 shows an elemental cell of the type typically used in the present invention with an associated switching device and source of control signals.

FIG. 1 shows an elemental liquid crystal cell 101 connected through a bilateral switch 102 to a source of control signals 103. The liquid crystal cell is advantageously of the twisted nematic field-effect variety. While the details of fabrication may vary in different embodiments of the present invention, assuming any of the particular structures described in the prior art, each embodiment will include the basic elements of a nematic liquid crystal film contained between two conducting layers. As such, the liquid crystal cell forms a capacitor, with the liquid crystal cell constituting at least part of the dielectric. The typical capacitance of a liquid crystal cell is 5 – 10pF, while the cell resistance is of the order of $10^{12}$ ohm. Not specifically shown in FIG. 1 are the various polarizers, color filters, reflectors and other structures well-known in the art for rendering visible the desired contrasting images. Such elements are described in detail in the above-cited Castellano et al paper and Fischer patent, both of which are hereby incorporated by reference.

Figure 2:
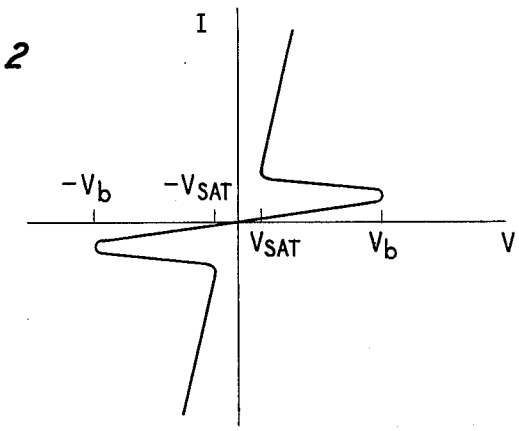
FIG. 2 shows a characteristic curve for the switching device of FIG. 1.

Bilateral switch 102 is advantageously of the PNPN variety, and may assume the typical form of a General Electric 2N4993 silicon bilateral switch. FIG. 2 gives a typical (not to scale) I-V characteristic curve for switching device 102. It will be recognized that a switch like 102 exhibits a negative incremental impedance. In operation, a voltage of positive or negative polarity with magnitude greater than the breakover voltage $V_b$ causes a switching from the off or blocked state to the on or saturated state. The impedance of the device in the saturated state is of the order of only a few ohms, while the impedance in the off states is at least several megohms. Moreover, the switching from the off to the on state is accomplished with great rapidity, with typical switching times in the range of 100 nsec or less.

Source 103 supplies alternating positive and negative pulses of magnitude $V_M > V_b$. Alternating polarity pulses are required to avoid any long term degradation of the liquid crystal materials of the type presently available and to contribute in a manner to be described below to the basic operating cycle according to the present invention.

In operation, the circuit of FIG. 1 utilizes a first pulse, say of positive polarity (terminal 104 positive relative to terminal 105) and having magnitude $V_M > V_b$, to cause bilateral switch 102 to assume the on state, thereby presenting a low impedance path to liquid crystal cell 101. This has the effect of charging the cell 101 (viewed as a capacitor) to a voltage $V_M$, with polarity as shown in FIG. 1. Since switch 102 is very fast in switching from the off to the on state, and since source 103 is chosen to be a low impedance source, the capacitor of cell 101 is charged very rapidly.

The effect of having the capacitor of FIG. 1 charged as shown, is to impress a field across the liquid crystal dielectric sufficient to untwist the twisted nematic polarizing effect in cell 101. Of course, in appropriate cases, the cell may in its no-field condition exhibit the untwisted state and have the field give rise to the 90° twist described above. In each case the polarizer and analyzer structures will be chosen accordingly.

Most importantly, the pulses supplied by source 103 may be very short because of the fast switching of switch 102 and the small capacitance of cell 101. After the positive pulse from source 103 is terminated, switch 102 presents a very high impedance to the stored charge on cell 101. Further, since the internal resistance of cell 101 is advantageously very large, the decrease in the stored charge by leakage is relatively slow. The overall effect, then, is to have the field created by the stored charge continue to act on the liquid crystal dielectric for a relatively long time. Thus, though the source pulse may be very short, the resulting field is relatively long lasting. The relatively long turn-on time for the elctro-optic effect of the cells is therefore of little consequence.

When, finally, the stored charge in cell 101 is reduced to a level which threatens to restore the cell to its twisted (or untwisted) no-field condition, source 103 provides another pulse of magnitude $V_M > V_b$. This latter pulse, however, is advantageously of negative polarity (terminal 105 being higher in potential than terminal 104) to provide the above-mentioned long-term material stability resulting from zero average current. The negative pulse again breaks down switch 102, deposits a charge on the cell capacitor opposite to that shown in FIG. 1, and, after the required time for cell turn-on, again establishes cell 101 in its full-field condition. Again, only the short pulse from source 103 is required to produce the relatively long term effect on cell 101.

Another useful aspect of the circuit in FIG. 1 will now be discussed. Suppose, after having applied an initial pulse of magnitude $V_M > V_b$, the following negative pulse is reduced in amplitude to $V_M'$, where $V_{SAT} < V_M' < V_b$. It will be assumed, however, that the period between the positive pulse and the succeeding negative pulse was short enough so that the charge stored in the capacitance of cell 101, with the polarity indicated in FIG. 1, had decreased only to $V_R$, where $V_R + V_M' > V_b$. It will be clear, then, that the series combination of a negative pulse with amplitude $V_M'$ and the voltage resulting from the charge stored on the capacitance of cell 101 is sufficient to cause a breakdown of bilateral switch 102. This, in turn, results in a rapid reversal of the polarity of the charge stored in cell 101, with the voltage resulting from this charge approximating $V_M'$ and with the polarity being the reverse of that shown in FIG. 1.

Upon the application of a succeeding positive pulse with amplitude $V_M'$, the above sequence will be repeated if $V_R'$, the voltage retained after the interpulse interval by the capacitance of cell 101 upon application of a pulse $V_M'$, is such that $V_M' + V_R' > V_b$. Thus, having once broken down switch 102 by a pulse with amplitude greater than $V_b$, only a lesser amplitude pulse of alternating polarity is required to sustain the liquid crystal cell in its full-field or on state. It will now be shown how the circuit combination of FIG. 1 may be used to advantage in a multiplexed matrix liquid crystal display.

Figure 3:
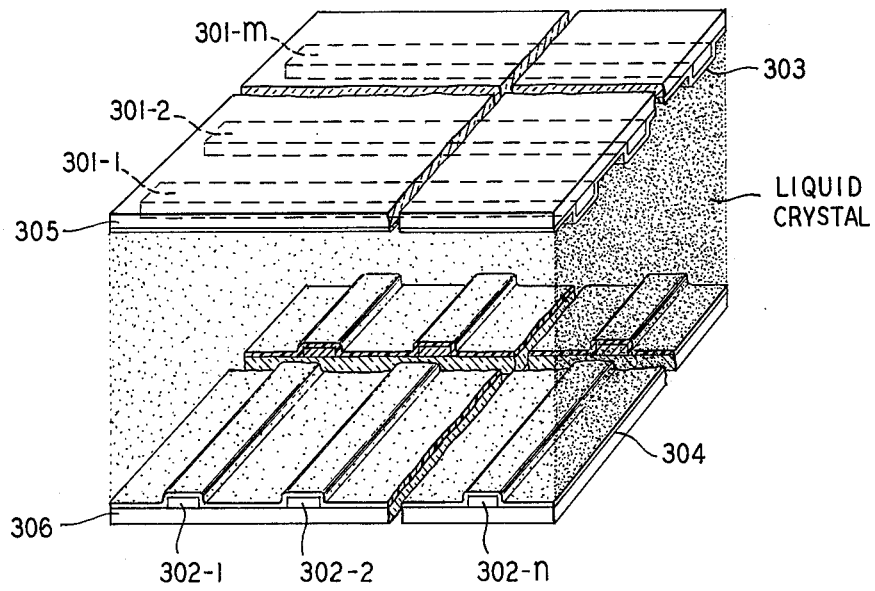
FIG. 3 shows typical panel construction for a liquid crystal matrix in accordance with one aspect of the present invention.

FIG. 3 shows typical X (top) and Y (bottom) electrodes, 301-$i$ and 302-$j$, respectively, $i = 1,2, \ldots, m$, $j = 1,2, \ldots, n$, laid on respective top and bottom plates 305 and 306. Covering each set of electrodes may be additional dielectric layers 303 and 304 which serve to increase the cell capacitances. The two plates 305 and 306 are, when sealed in standard fashion along their edges, used to confine the liquid crystal film as in the prior art. With the exception of the extra dielectric layers, which are advantageous in increasing cell memory, the matrix of liquid crystal cells shown in FIG. 3 may be fabricated in accordance with the teachings of the Fischer or Tsukamoto patents, supra, or the Castellano paper. The inclusion of the extra dielectric layers may be achieved using, e.g., standard silk screen or photolithographic techniques. Also useful in illustrating prior art panel fabrication and driving circuit technology is Brody, et al., "A 6 × 6 Inch 20 Lines-per-Inch Liquid Crystal Display Panel," IEEE Transactions on Electron Devices, Vol. Ed-20, No. 11, November 1973, pp. 995–1001, which is hereby incorporated by reference.

Figure 4:
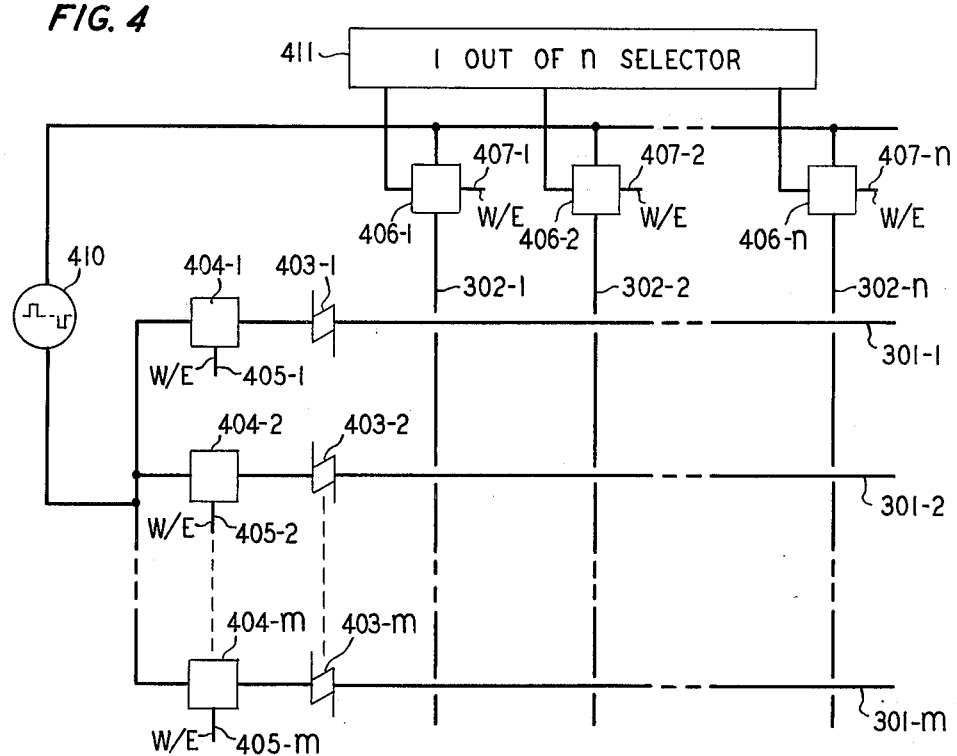
FIG. 4 illustrates the panel of FIG. 4 connected to drive circuitry in accordance with another aspect of the present invention.

FIG. 4 illustrates driving circuitry for a panel like that shown in FIG. 3 which, in accordance with one aspect of the present invention, permits simplified multiplexing of relatively few drive circuits, and which requires no information-bearing refresh signals to maintain an established pattern of on and off cells.

In FIG. 4 the liquid crystal cells are not explicitly indicated. Rather, only the row electrodes 301-$i$ and column electrodes 302-$j$ are shown schematically. Connected to each row electrode 301-$i$ is a corresponding bilateral switch 403-$i$, each of which is substantially identical to that shown in FIG. 1, characterized in FIG. 2 and described above. Also connected to bilateral switches 403-$i$ are corresponding control gates 404-$i$ which respond to write/erase (W/E) signals on respective leads 405-$i$ to contribute to writing or erasing information at a cell defined in part by electrode 301-$i$. Gates 404-$i$ also respond to sustain generator 410 to apply non-information-bearing sustain signals to the row electrodes.

Column electrodes 302-$j$ also have control gates, designated 406-$j$ in FIG. 4, which control the application of write/erase address signals applied on leads 407-$j$ and sustain signals from sustain generator 410. Gates 406-$j$ are responsive, in part, to 1-out-of-$n$ selector 411 in applying control signals to the array of liquid crystal cells. The operation of the circuit of FIG. 4 will be described with the aid of the waveforms appearing in FIG. 6.

Figure 5:
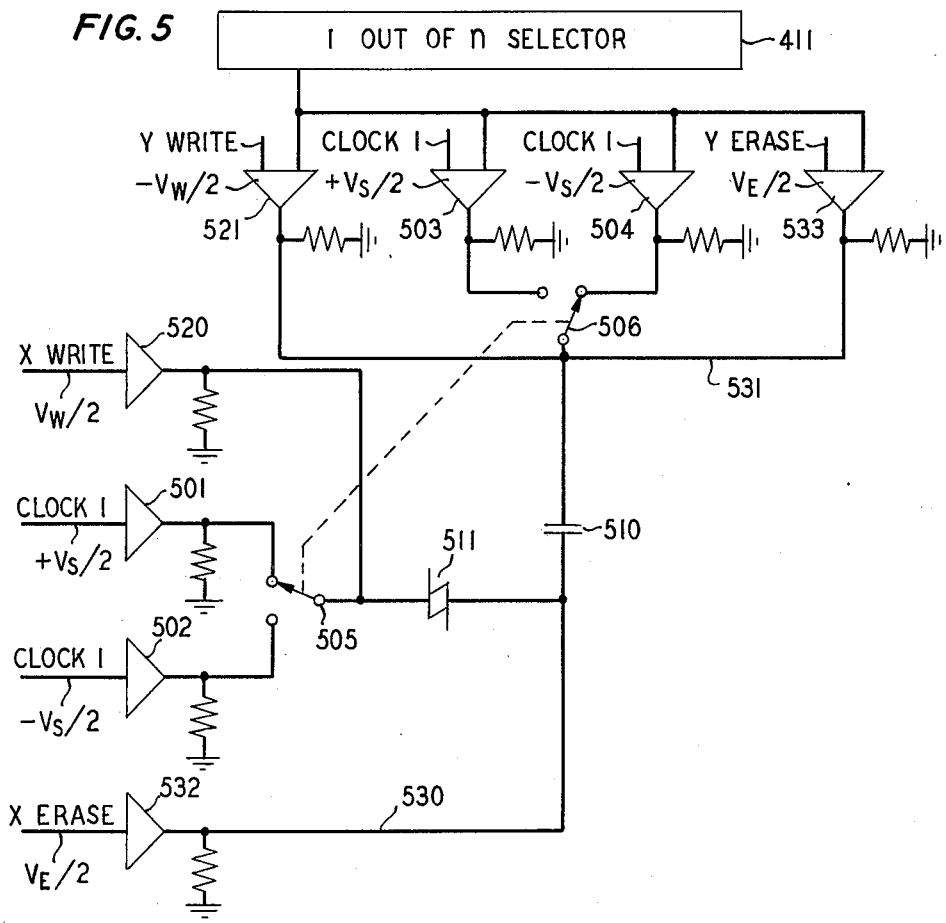
FIG. 5 illustrates a typical cell in the matrix of FIG. 4 and illustrative associated drive circuitry in accordance with one embodiment of the present invention.

It proves convenient, however, to consider first a simplified logic circuit equivalent for a single one of the liquid crystal control paths in FIG. 4 (similar to that shown in FIG. 1), appearing in FIG. 5. Thus a CLOCK1 signal like that shown in FIG. 6 as waveform 601 is applied periodically to sustain drivers 501–504. Drivers 501 and 503 are positive pulse generators supplying waveforms like 602 in FIG. 6, while drivers 502 and 504 supply signals having waveforms like 603 in FIG. 6. When switches 505 and 506 are in the positions indicated, when cell 510 is initially uncharged, and when 1-out-of-$n$ selector 411 selects the column containing cell 510, the effective voltage applied across the combination of cell 510 and bilateral switch 511 is $-V_S$, where positive polarity as in FIG. 1 is taken as the top of cell 510 being positive relative to the bottom.

It is assumed that the magnitude of the sustain signal, $V_S$, is such that $V_S < V_b$, i.e., the sustain signal is not itself sufficient to cause the bilateral switch 511 to turn on. Accordingly, the on cell 510 maintains a zero level voltage when only the sustain signal is applied. This condition continues when, during the next and succeeding CLOCK1 periods, switches 505 and 506 alternate in synchronism, causing a sustain signal like waveform 604 in FIG. 6 to be applied to the combination of switch 511 and cell 510. The time between successive pulses for the sustain signal applied to any given cell will, because of scanning by 1-out-of-$n$ selector 411, be equal to $n$ times the period for the CLOCK1 signal. Further, using the alternating switch arrangement of FIG. 5, it proves convenient to choose $n$ equal to an odd number to insure alternating positive and negative sustain pulses at each cell. Other equivalent scanning and clock techniques may, of course, be used to insure the last-mentioned alternation of sustain pulse polarity.

Figure 6:
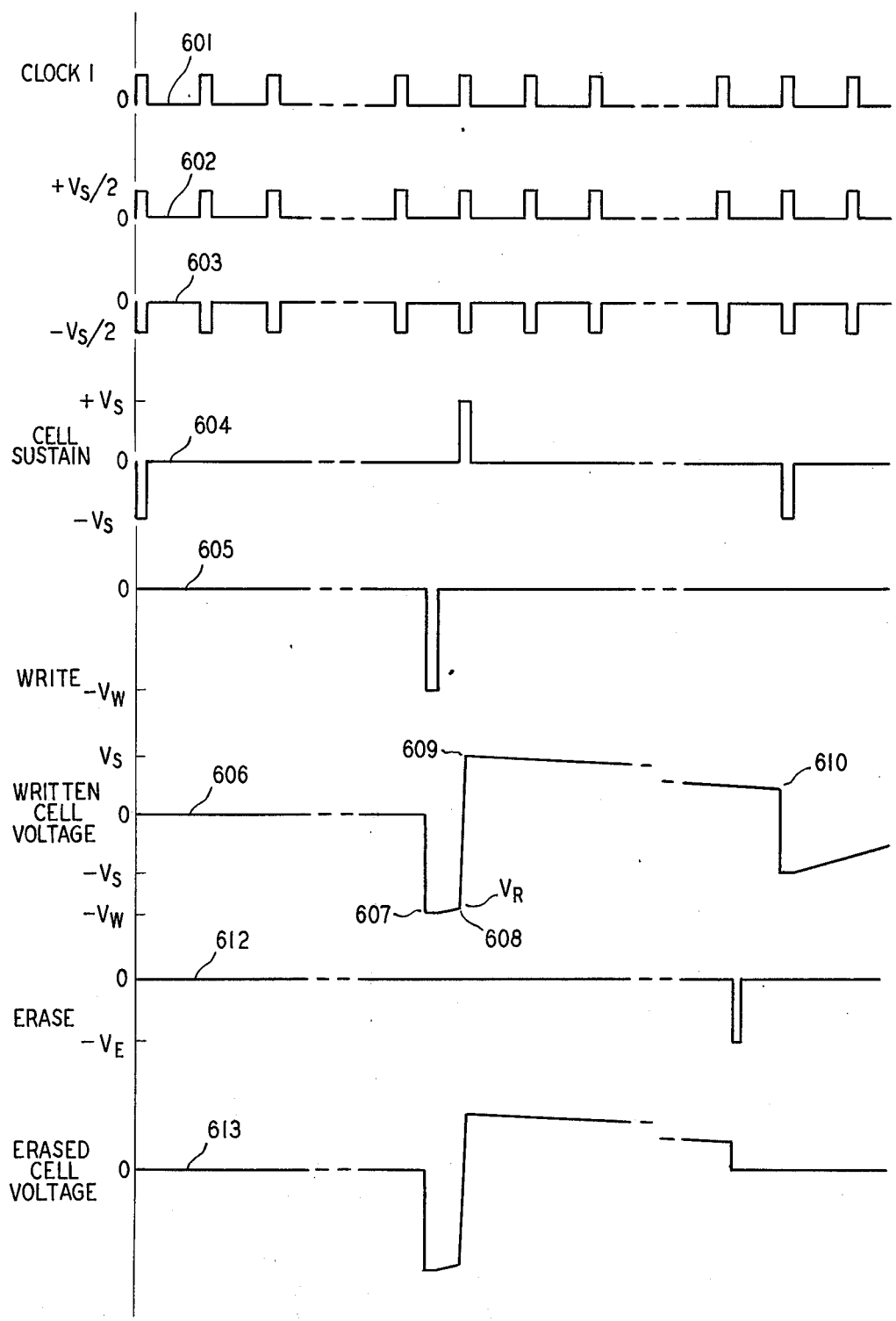
FIG. 6 illustrates typical waveforms associated with the circuitry of FIGS. 4 and 5.

When half-select write pulses each of magnitude $V_W/2$ are applied to cell 510 and switch 511 by each of generators 520 and 521 in response to externally applied X WRITE and Y WRITE signals, and where $V_W > V_b$, bilateral switch 511 breaks down and cell 510 charges to a voltage approximating $-V_W$ as shown at point 607 on waveform 606 in FIG. 6. This voltage decreases slowly through internal and external leakage currents, but at point 608 on waveform 606 is still equal in magnitude to $V_R$, where $V_R + V_S > V_b$. Thus, when a following positive sustain signal appears, the algebraic sum of $V_R$ and $V_S$ is sufficient to again break down bilateral switch 511 and cause cell 510 to charge to $+V_S$ as shown at point 609 on curve 606.

The voltage on cell 510 again decays slowly to point 610 on curve 606, at which time ($n$ CLOCK1 cycles after point 609 was reached) the next negative sustain pulse is applied to the combination of cell 510 and switch 511. The algebraic sum of $V_R'$, the voltage at point 610 on curve 606, and $-V_S$ is sufficient to again break down switch 511 and charge cell 510 to $-V_S$.

It will be appreciated that the condition exhibited by curve 606, with alternating polarity sustain signals being algebraically summed with a pre-existing voltage stored in cell 510, will continue absent any other system changes. It will also be noted, that an initial write voltage with $V_W > V_b$, was required to initiate the cell charging sequence. The periodic column scanning sustain signals, when combined in a half-select mode with the periodic row sustain signals, are sufficient to retain a cell such as 510 in the on condition, but are not sufficient to initially establish a cell in that on condition.

Curve 612 illustrates an erase pulse applied in a half-select fashion by erase pulse generators 532 and 533 to the X ERASE and Y ERASE leads, 530 and 531, respectively, in FIG. 5. These pulses operate in substantially the same manner as write pulses, but because of their shorter duration, cause a voltage to be stored on the walls of cell 510 which, when combined with subsequent sustain signals fails to break down bilateral switch 511. This erase process is substantially similar to that employed in plasma panel displays. Curve 613 illustrates the erase process for the case where a write pulse like that shown in curve 605 is followed by an erase pulse like that shown in curve 612.

Returning to FIG. 4, it is clear that successive horizontal half select sustain pulses are simultaneously applied to each row electrode 301-$i$, while the vertical half select signals are sequentially and periodically applied to column electrode 302-$j$. The scanning of the columns is useful in preventing the sustain voltage from being applied to all cells in a row having one cell on. Thus, if it were not for the scanning operation, the stored voltage on one cell in a row, having caused a breakdown of the bilateral switch for that row, would cause the sustain voltage to be restored in all cells of that row. Likewise, it proves convenient to write and erase on a colume-by-column basis. Thus the Y WRITE and Y ERASE signals are advantageously gated by the selection signals from 1-out-of-$n$ selector 411.

It proves advantageous in some embodiments of the present invention to use a liquid crystal material which exhibits a voltage dependent capacitance. This enhances cross talk between on and off cells by having a lower value for cell capacitance at an off cell than an on cell. Materials of the type discussed in Baise et al, "Effect of Dielectric Anisotropy on Twisted Nematics," *Applied Physics Letters*, April, 1974, pp. 298–300.

Because cell capacitance can be chosen to be rather higher than is commonly used in liquid cyrstal display systems, the rate of sustaining can be relatively slow. Most importantly, however, these sustain signals need not be information bearing. Thus, the data source, e.g., a computer, need not be continually refreshing the display; only picture modifications need be communicated to the array of liquid crystal cells.

Thus the display system of the present invention provides a low power display with memory. The write and erase signals can be very short, even though the liquid crystal materials may take some milliseconds to assume the indicated change state. Simple high-speed multiplexing is therefore a reality for the first time in liquid crystal display systems.

While it has been assumed for simplicity that the signals to be displayed are bilevel, no such limitation is fundamental to the present invention. By simply modulating the amplitude of the sustain signals, a gray scale display system may be realized. Likewise, though each matrix crosspoint in the system of FIG. 4 has been assumed to be independent, merely grouping cell locations in triads and covering them with the usual blue, green and red filters, a color display may be readily achieved while not sacrificing the efficiency and simplicity of the bilevel embodiment of the present invention described in detail above. Thus, e.g., the panel fabrication utilizing filters as described in the Fischer patent, supra, may be adapted to advantage in accordance with the above teachings. Again, intensity modulation may be effected by varying the sustain signal amplitude.

While the preceding detailed description has emphasized particular materials, switching and control devices and geometrical arrangements, it will be clear to those skilled in the art that equivalents to the particular illustrative choices given above will be appropriate in many applications of the present invention. Further, while the particular capacitor used for storing information was associated with a liquid crystal cell, the capacitor-bilateral switch structure will find application in other contexts.

What is claimed is:

1. Apparatus comprising
a plurality of capacitive display cells, each comprising first and second conductors and a layer of liquid crystal material and one or more additional layers of dielectric material confined between said conductors,
means for initially storing signals in selected ones of said display cells,
a source for repetitive alternating polarity signals, and
switching means unresponsive to said alternating polarity signals alone but responsive to the sum of said alternating polarity signals with signals of at least a predetermined minimum magnitude stored in said selected display cells for repetitively applying said alternating polarity signals to said selected display cells,
said display cells being disposed in a rectangular matrix, said first conductors comprising a plurality of conductors each common to cells in a plurality of rows of said matrix, and said second conductors comprising a plurality of conductors each common to cells in a plurality of columns of said matrix,
said switching means comprising a plurality of bilateral threshold switches each connected between said source of signals and a respective one of said conductors common to cells in a plurality columns of said matrix, said switching means further comprising means for sequentially connecting each of said conductors common to a plurality of rows of said matrix to said source of signals.

2. Apparatus comprising
a plurality of row conductors,
a plurality of column conductors, said column conductors aligned perpendicularly with respect to said row conductors,
a layer of liquid crystal material confined between said row and column conductors,
means for applying write signals to selected ones of said row and column conductors,
a source of alternating polarity signals,
means for sequentially connecting each of said column conductors to said source, and
switching means connected between each of said row conductors and said source, said switching means being responsive to the sum of said alternating polarity signals with signals of at least a predetermined minimum magnitude appearing across said selected rows and columns for connecting said selected rows to said source, but said switching means being unresponsive to said alternating polarity signals alone.

3. Apparatus according to claim 2 wherein each of said switching means comprises a bilateral threshold switch having a threshold in excess of the magnitude of said alternating polarity signals, but less than the magnitude of the sum of said alternating polarity signals and said signals appearing across said selected rows and columns.

4. Apparatus comprising,
a plurality of liquid crystal display elements having inherent capacitance, and each having first and second terminals,
a plurality of bilateral switches each having first and second terminals and each presenting a low impedance between said terminals when a voltage of magnitude in excess of first threshold $V_b$ is applied between its terminals, but presenting a high impedance when the voltage applied between its terminals thereafter becomes less than a second threshold $V_{sat}$, a source of periodic alternating polarity signals of magnitude $V_s < V_b$, said source having first and second terminals, means for connection the first terminal of each switch and the second terminal of each display element to said first and second terminals, respectively, of said source and for connecting the second terminal of each switch to the first terminals of an associated plurality of the display elements, and means for storing a voltage of magnitude greater than $V_b - V_s$ across selected display elements, said storing means comprising means for applying a voltage $V_M > V_b$ between the second terminal of each selected display element and the first terminal of the switch associated therewith.

5. Apparatus according to claim 4 further comprising means for reducing the magnitude of the voltage stored across said selected display elements to less than $V_b - V_s$.

6. Apparatus according to claim 4 wherein said liquid crystal display element each comprise two conductors surrounding a layer of liquid crystal material.

7. Apparatus according to claim 6 wherein said liquid crystal layer comprises a nematic field effect liquid crystal material.

8. Apparatus according to claim 4 wherein each bilateral switch comprises a bilateral PNPN device.

9. Apparatus according to claim 6 further comprising a first light polarized layer on one side of each liquid crystal display element and a second light polarized layer on the opposite side thereof, the direction of polarization for said second polarized layer being rotated 90° relative to that of said first polarized layer.

* * * * *